United States Patent
Nishikawa et al.

[11] Patent Number: 5,979,048
[45] Date of Patent: Nov. 9, 1999

[54] METHOD OF MANUFACTURING CONNECTORS

[75] Inventors: Yoshiaki Nishikawa, Fujinomiya; Tetsuo Yumoto, Tokorozawa, both of Japan

[73] Assignees: Polyplastics, Co., Inc.; Sankyoukasei Co., Ltd, both of Japan

[21] Appl. No.: 08/813,893

[22] Filed: Mar. 7, 1997

Related U.S. Application Data

[63] Continuation-in-part of application No. 08/464,661, Jun. 21, 1995, abandoned.

[51] Int. Cl.$^6$ .................................................. H01R 43/00
[52] U.S. Cl. ................................ 29/885; 29/847; 29/848; 29/860
[58] Field of Search ................... 29/885, 847, 848, 29/849, 860

[56] References Cited

U.S. PATENT DOCUMENTS

| | | |
|---|---|---|
| 3,747,210 | 7/1973 | Kroll . |
| 4,689,103 | 8/1987 | Elarde . |
| 4,812,353 | 3/1989 | Yumoto . |
| 4,858,313 | 8/1989 | Bowlin . |
| 4,949,453 | 8/1990 | Neumann et al. . |
| 5,049,244 | 9/1991 | Yarita et al. . |
| 5,611,699 | 3/1997 | Tanigawa .................. 439/78 |

*Primary Examiner*—Lee Young
*Assistant Examiner*—Kevin G Vereene
*Attorney, Agent, or Firm*—Depaoli & Frenkel, P.C.

[57] ABSTRACT

A method of simultaneously manufacturing a plurality of connectors involves:

molding a resin to form a connector member assembly containing multiple connector members, each member having one or two opposite longitudinally elongated through-holes extending between front and rear faces of the member along opposite sides thereof;

forming a first metal coating on the front and rear faces and on an inner surface of each through-hole;

providing metal-platable and non-metal-platable regions on each first-metal-coated front and rear face;

forming a second metal coating on the metal-platable regions to form conductive patterns and on each first-metal-plated inner surface to form a conductive inner surface;

removing the first metal coating from the non-metal-platable regions to form non-conductive patterns;

then detaching each connector member from the connector assembly, each detached member having one or two side faces containing the metal-plated inner surface of the one or two through-holes; and removing the first and second metal coatings from a portion of each side face to form a side-face conductive pattern disposed in electrical communication with the conductive patterns of the front and rear faces.

6 Claims, 5 Drawing Sheets

METHOD OF MANUFACTURING CONNECTORS

This is a Continuation-in-Part of U.S. Application Ser. No. 08/464,661, Filed on Jun. 21, 1995 now abandoned.

BACKGROUND OF THE INVENTION

The present invention relates to a method of manufacturing connectors useful in mounting an electric part, such as, e.g., an integrated circuit (IC), a capacitor or a resistance, and electrically connecting the electric part to a circuit board. More particularly, this invention relates to a method of simultaneously making a plurality of such connectors.

A known photoresist process is not applicable to form a conductive pattern on a vertical surface (i.e., a side face) of connectors. Conventional methods manufacture a metal plating part and a non-plating part separately. In conventional methods, a thermoplastic resin having good plate adhesion is injection molded to form a primary molded body having a specific surface on which a conductive pattern is formed. Another thermoplastic resin having poor plate adhesion is then injection molded on the primary molded body to form, integrally with the primary molded body, a secondary molded body which does not include any surface on which a conductive pattern is formed. The whole surface of the resulting molded object is plated with a metal. This allows only the specific surface of the primary molded body to be plated with the metal to form a conductive pattern.

The conventional methods involve relatively complicated manufacturing processes and require two different materials and molds, thereby having drawbacks of rather low production efficiency and high manufacturing cost.

Thus, it would be desirable to provide a method of making connectors which is relatively efficient and involves relatively low manufacturing costs. Specifically, it would be desirable to provide a method of making a plurality of connectors simultaneously. More particularly, it would be desirable to provide a method of making a plurality of connectors simultaneously wherein the front, rear and side faces of the connectors each have both conductive and non-conductive patterns formed thereon.

Methods of making connectors are disclosed, for example, in U.S. Pat. Nos. 5,049,244; 4,949,453; and 4,858,313; each of the foregoing references being hereby incorporated by reference herein in its entirety.

However, the aforementioned U.S. Pat. Nos. 5,049,244 and 4,858,313 do not teach or suggest a method of making a plurality of connectors. Furthermore, the aforementioned U.S. Pat. Nos. 4,949,453 and 4,858,313 do not teach or suggest a method of making a plurality of connectors wherein the side faces of the connectors have both conductive and non-conductive patterns formed thereon.

Accordingly, a primary object of the invention is to provide a novel method of manufacturing a plurality of connectors simultaneously in order to improve the efficiency of production and reduce the manufacturing cost associated with connector manufacturing processes.

A further object of this invention is to provide a method of manufacturing a plurality of connectors simultaneously, wherein the front, rear and side faces of the connectors each have conductive and non-conductive patterns formed thereon.

These and other objects which are achieved according to the present invention can be readily discerned from the following description.

SUMMARY OF THE INVENTION

The foregoing objects are achieved in the present invention. The present invention provides a method of simultaneously making a plurality of connectors each having conductive patterns formed on a front face, a rear face and one or two opposite side faces thereof. Such method involves the steps of:

(A) molding a resin in a single multiforming mold to form a connector member assembly containing a plurality of connector members and a plurality of runners attached to the members, each connector member having a front face, a rear face, and one or two opposite longitudinally elongated through-holes which extend from the front face to the rear face along opposite sides of the connector member, wherein each through-hole has an inner surface;

(B) forming a first metal coating on the front and rear faces and on an inner surface of each through-hole;

(C) providing metal-platable and non-metal-platable regions on each first-metal-coated front and rear face;

(D) forming a second metal coating on the metal-platable regions to form conductive patterns and on each first-metal-plated inner surface to form a conductive inner surface;

(E) removing the first metal coating from the non-metal-platable regions to form non-conductive patterns;

(F) after steps (A)–(E), detaching each connector member from the connector assembly, each detached member having one or two side faces containing the metal-plated inner surface of the one or two through-holes; and (G) in each detached member, removing the first and second metal coatings from a portion of each side face to form a side-face conductive pattern disposed in electrical communication with the conductive patterns of the front and rear faces of said detached member.

The method of this invention has several advantages. For example, the method of this invention provides connectors which have conductive and non-conductive patterns formed on the front, rear and side faces thereof. Furthermore, the method of this invention requires only one material for forming the main body of the connector, thereby effectively reducing manufacturing costs. In addition, the method of this invention uses a single multiforming mold which allows a plurality of connectors to be formed simultaneously, thereby improving production efficiency.

DETAILED DESCRIPTION OF THE INVENTION

As stated hereinabove, the present invention provides a method of simultaneously making a plurality of connectors.

Figure 1:
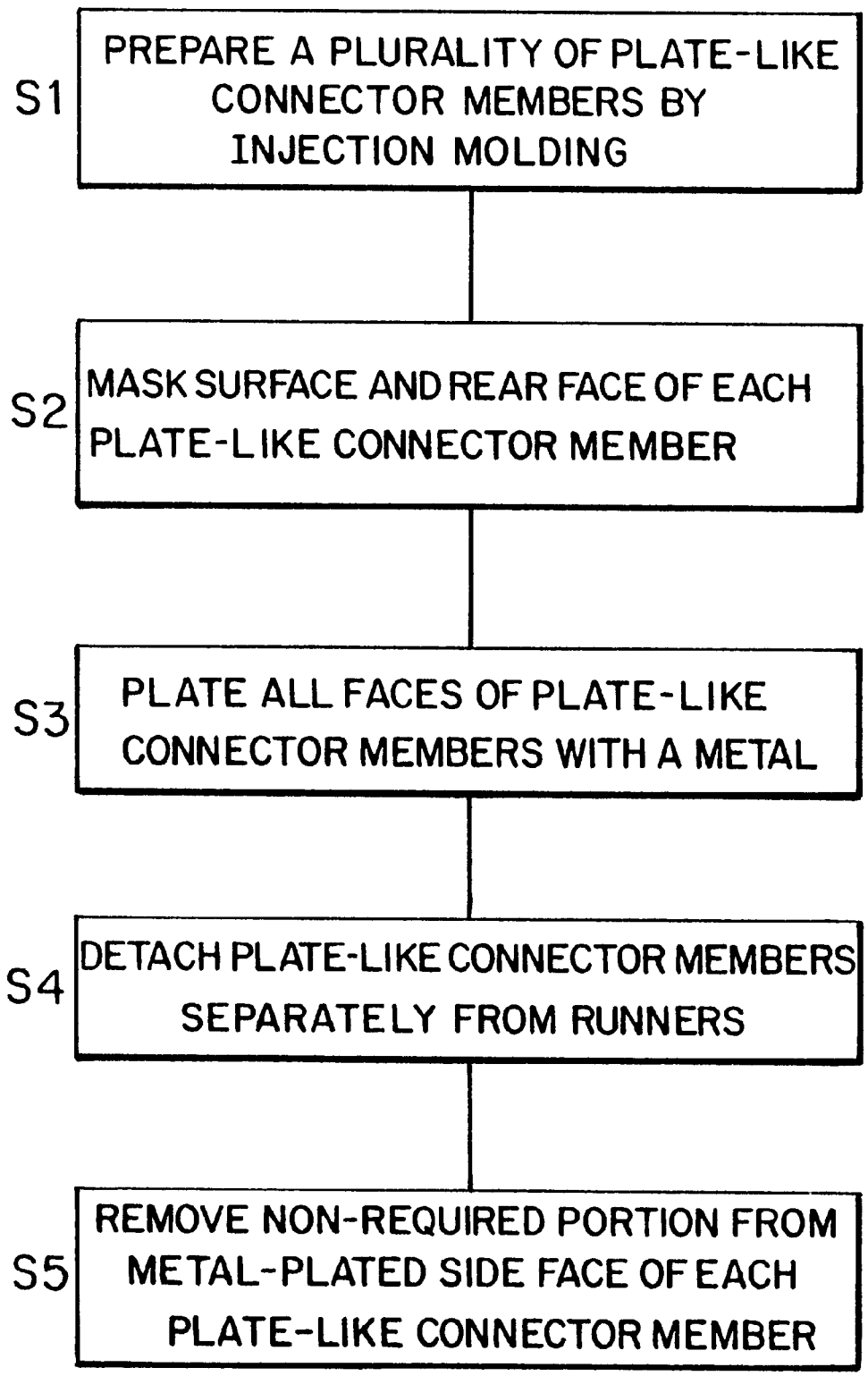
FIG. 1 shows a flow chart of most of the steps of one preferred embodiment of the method of the present invention.

In step (A) of the method of this invention, a resin is molded in a single multiforming mold to form a connector member assembly composed of a plurality of connector members and a plurality of runners attached to the members (see FIG. 1, step S1). Each connector member has a front face, a rear face, and one or two opposite longitudinally elongated through-holes which extend from the front face to the rear face along opposite sides of the connector member. Each through-hole has an inner surface.

Figure 2A:
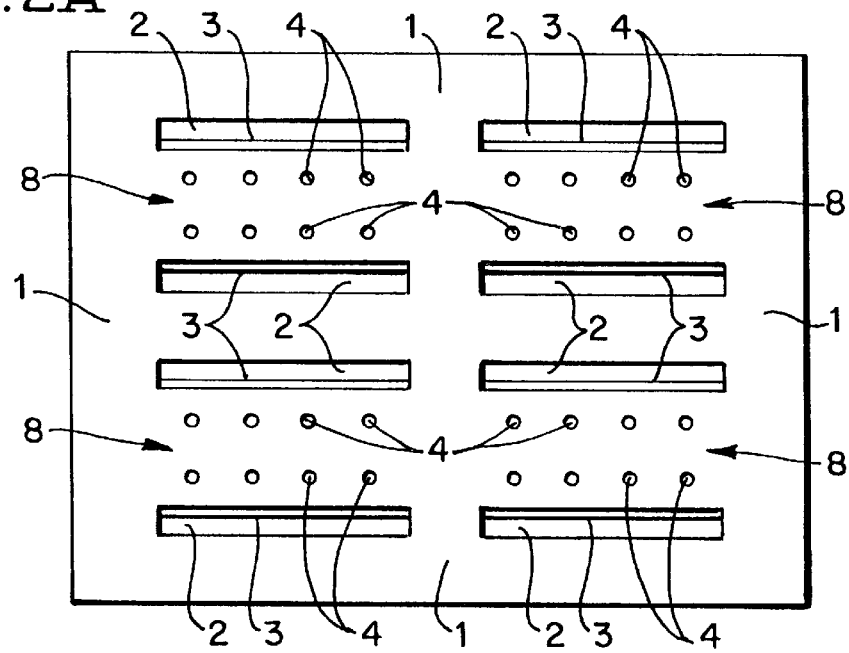
FIG. 2A is a view of the front face of a connector member assembly formed in the method of this invention.
Figure 2B:
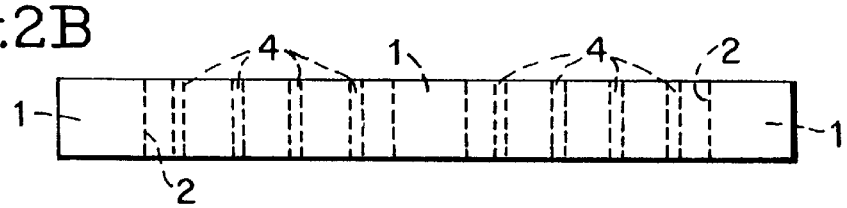
FIG. 2B is a view of the inner surfaces of the through-holes formed in the connector member assembly the front face of which is shown in FIG. 2A.
Figure 2C:
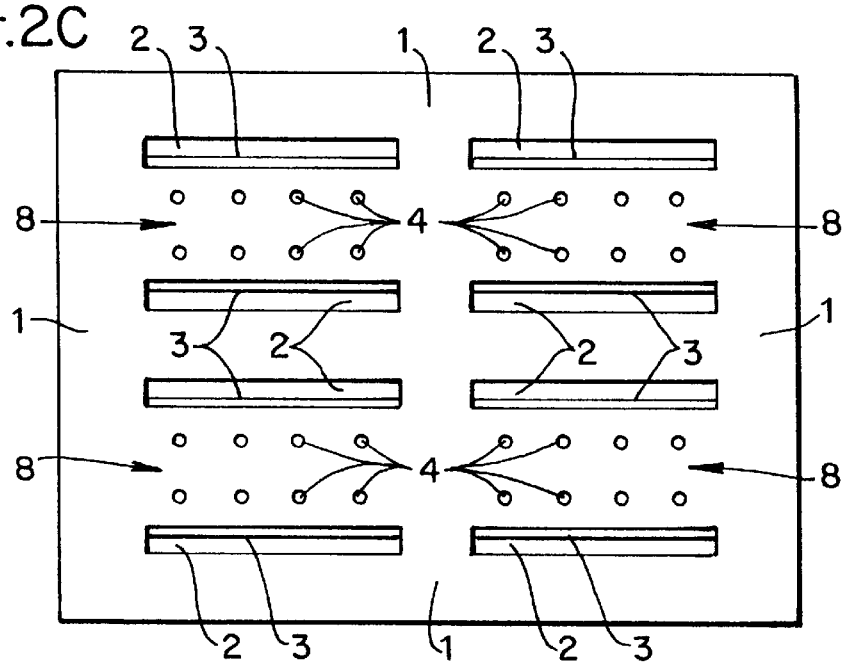
FIG. 2C is a view of the rear face of the connector member assembly the front face of which is shown in FIG. 2A.

The front and rear faces of the connector members are shown in FIGS. 2A and 2C, respectively. The inner surfaces of the through-holes are shown in FIG. 2B.

As shown in FIGS. 2A–2C, four plate-like connector members 8 are formed between runners 1,1. A plurality of longitudinally elongated through-hole slits 2 are formed between the runners 1,1 and the respective side faces of the four plate-like connector members 8 on which desired conductive patterns are to be formed. The side faces of the members 8 correspond to inner surfaces of the slits 2. Each side face of the plate-like connector member 8 also has a step member 3. A plurality of through-holes 4 run from a front face to a rear face of each plate-like connector member 8. A connection pin of an electric part is inserted in each of the through-holes 4.

In preferred embodiments of step (A), the connector member assembly is formed by an injection molding process.

Also preferably, the resin is a thermoplastic resin.

In step (B) of the method of the present invention, a first metal coating is formed on the front and rear faces of each connector member and on the inner surface of each through-hole. Such first metal coating is also referred to herein as a thin metal film.

The first metal coating can be formed by various suitable processes, including, e.g., chemical plating, sputtering, vacuum deposition (evaporation) and ion plating. In practice, vacuum deposition or sputtering is performed twice, i.e., to the front and rear faces of the connector member. The thin metal film is then adhered to the inner surface(s) of the through-hole(s) in the two operations, thus realizing further reliable adhesion.

Examples of suitable metals which can serve as the first metal include copper and aluminum.

The thickness of the first metal coating typically ranges from several hundred to several thousand angstroms.

In step (C) of the method of this invention, a metal-platable region and a non-metal-platable region are provided on each first-metal-coated front face and on each first-metal-coated rear face.

The metal-platable regions and the non-metal-platable platable regions are preferably formed by either a masking process or a laser beam patterning process.

The masking process, referred to as step S2 in the FIG. 1 flow chart, generally involves disposing a masking layer onto a region of each of the first-metal-coated front and rear faces so as to provide each of the front and rear faces with a masked region and a non-masked region. The masked region constitutes the non-metal-platable region and the non-masked region constitutes the metal-platable region. Thus, the masking layer forms a pattern on the front and rear faces, the pattern delineating the metal-platable and non-metal-platable regions. During formation of the second metal coating, e.g., by electroplating, the masked regions are not metal-plated whereas the non-masked regions are metal-plated.

After the second metal coating is formed, the masking layer and the thin metal film underneath such masking layer are removed successively by appropriate measures, e.g., etching.

The masking layer can be composed of a hot melt resin or a resist such as a photoresist.

Laser beam patterning generally involves separating metal-platable portions from non-metal-platable portions with a boundary line. Thus, in the method of this invention, laser beam patterning of the assembly generally involves directing a laser beam along a boundary line which is to separate the metal-platable and non-metal-platable regions from one another. Typically, laser beam patterning is accomplished by either of two methods.

In a first method, laser beams are used to remove the thin metal film along the boundary line separating a metal-platable region from a non-metal-platable region so that the non-metal-platable region is surrounded by an insulating closed circuit formed where the film is removed along the boundary line. The boundary line may be quite thin insofar as electrical conduction is not established between the metal-platable and non-metal-platable regions. The metal-platable regions extend to the inner surfaces of the through-hole slits (which form the side faces of the connector members). The boundary line functions as an insulator surrounding the non-metal-platable regions. Electroplating, wherein electrodes are attached to the metal-platable regions and the inner surfaces, is preferably used to form the second metal coating. The non-metal-platable regions are not electroplated because such regions are insulated by the boundary line. The boundary line itself is also not electroplated. After formation of the second metal coating, the thin metal film can then be removed from the non-metal-platable regions by etching.

In a second laser beam patterning method, the thin metal film is completely removed from the non-metal-platable region.

The first laser beam patterning method described above is more efficient than the second laser beam patterning method because, in the latter method, the thin metal film (i.e., the first metal coating) must be removed from the entire area of the non-metal-platable regions. If the first laser beam patterning method is used, the thin metal film is removed from the non-metal-platable region after the electroplating step. However, such removal can be easily effected by various measures, e.g., acid etching.

Figure 3A:
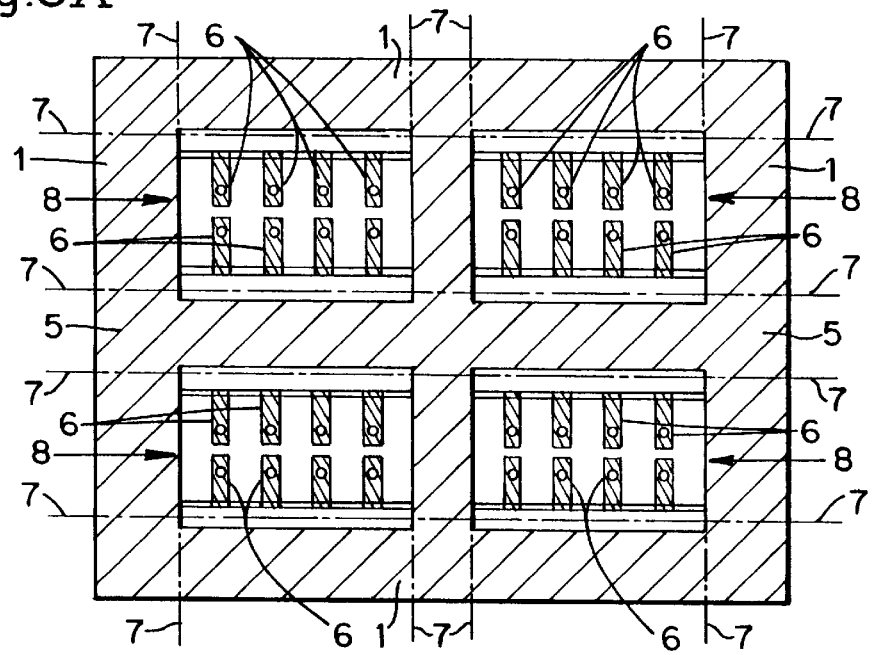
FIG. 3A shows the front face of the connector member assembly shown in FIG. 2A, wherein the front face shown in FIG. 3A is metal-plated.
Figure 3B:
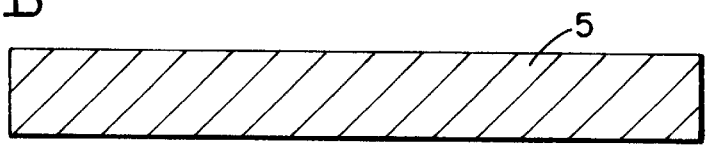
FIG. 3B shows the inner surface of the through-holes formed in the connector member assembly as shown in FIG. 2B, wherein the inner surface shown in FIG. 3B is metal-plated.
Figure 3C:
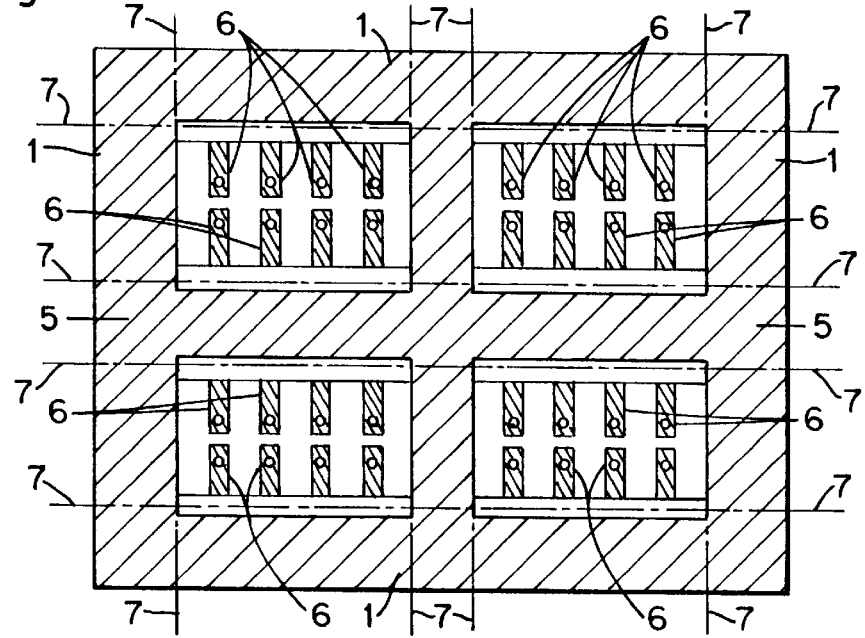
FIG. 3C shows the rear face of the connector member assembly shown in FIG. 2C, wherein the rear face shown in FIG. 3C is metal-plated.

With reference to the figures herein, wherein the metal-platable and non-metal-platable regions are formed by a masking process, the front and rear faces of each connector member 8 is masked with a photomask. Application of the masking pattern separates specific portions on which a conductive pattern is to be formed from non-required portions. In other words, the masking pattern separates metal-platable portions from non-metal-platable portions. Preferably, in step (D) of the method of this invention (this step being discussed in greater detail hereinbelow) all the faces of the connector members 8 having the specified metal-platable portions and non-metal-platable portions are soaked in a metal plating solution (see step S3 in FIG. 1). This allows the non-masked portions on the front and rear surfaces of each connector member 8 to be plated, and also causes the metal plating solution to flow into each slit 2 to plate the non-masked whole side face of each connector member 8 (i.e., the inner surface of each slit 2) with the metal (see FIGS. 3A–3C). In FIGS. 3A–3C, the numeral 5 denotes a metal-plated region and the numeral 6 shows a conductive pattern formed by the metal plating process.

In step (D) of the method of this invention (referred to as step S3 in the FIG. 1 flow chart), a second metal coating is formed on the metal-platable regions of the front and rear faces and on an entire surface of the first-metal-coated inner surface of each through-hole, thereby rendering each metal-platable region a metal-plated region, the inner surface of each through-hole a metal-plated inner surface, and each non-metal-platable region a non-metal-plated region. Each metal-plated region constitutes a conductive region and each inner surface constitutes a conductive inner surface. The second metal coating is not formed on the non-metal-platable regions.

As mentioned hereinabove, the second metal coating process preferably involves soaking the connector member assembly in a metal plating solution. The second metal coating is formed on the thin metal film because the thin metal film serves as an undercoating electroplating layer.

The material of the second metal coating may be the same as or different from that of the thin metal film.

In step (E) of the method of this invention, the first metal coating is removed from the non-metal-plated region of each front and rear face so as to render each non-metal-plated region a non-conductive region.

If a masking process is used to form the metal-platable and non-metal-platable regions, step (E) will first involve removing the photo mask layer, which is the outer layer of the non-metal-plated region, and then removing the first metal coating which is disposed underneath the photo mask layer.

If a laser beam patterning process was used to form the metal-platable and non-metal-platable regions, step (E) will simply involve removing the first metal coating from the non-metal-plated region since the first metal coating comprises the outer layer of such region.

In step (F), which is performed after steps (A)–(E), each connector member is detached from the connector assembly (see step S4 in FIG. 1). Each detached connector member has a front face, a rear face and one or two opposite side faces, the front and rear faces corresponding to the front and rear faces of the undetached connector member, and the one or two opposite side faces corresponding to the inner surface of the one or two through-holes. The front face of each detached connector member has a conductive pattern disposed thereon which corresponds to the conductive (metal-plated) region formed on the front face of the undetached connector member. The rear face of each detached connector member has a conductive pattern corresponding to the conductive region formed on the rear face of the undetached connector member. The one or two opposite side faces of each detached connector member is entirely composed of the conductive surface of the inner surface of each through-hole of the undetached connector member.

As can be seen in FIGS. 3A–3C, the four platelike connector members 8 plated with the metal are detached separately from the runners 1 along cutting lines 7.

In step (G) of the method of this invention, the first and second metal coatings are removed from a first region of each conductive side face of each detached connector member and are allowed to remain on a second region of the conductive side surface, the second region being disposed in electrical communication with the conductive patterns disposed on the front and rear faces of the detached connector member. Thus, each side face of each detached connector member is provided with a non-conductive pattern composed of the first region and a side-face conductive pattern composed of the second region, wherein the side-face conductive pattern is disposed in electrical communication with the conductive patterns of the front and rear faces.

Figure 4A:
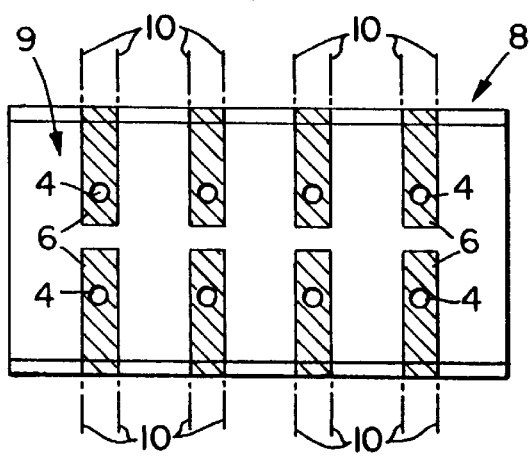
FIG. 4A is a view of the front faces of the connector members after detachment of the connector members from the assembly shown in FIG. 2A.
Figure 4B:
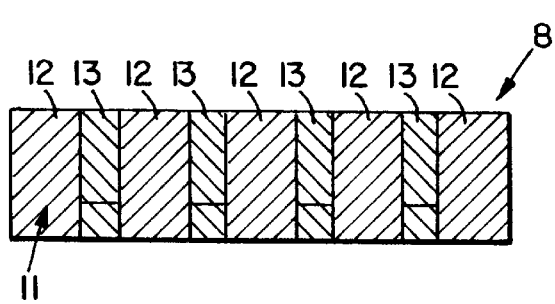
FIG. 4B is a view of the side faces of the connector members after detachment of the connector members from the assembly shown in FIG. 2B.
Figure 4C:
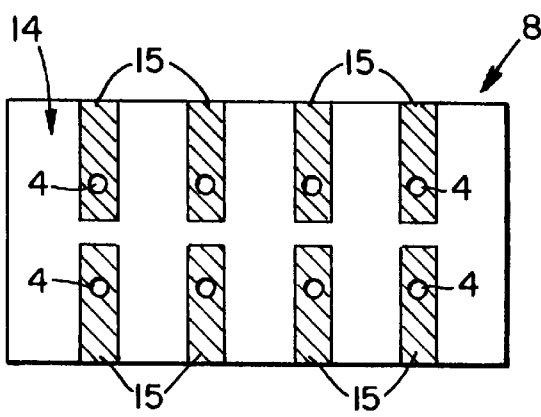
FIG. 4C is a view of the rear faces of the connector members after detachment of the connector members from the assembly shown in FIG. 2C.

As shown in FIGS. 4A–4C, a metal-plated side face 11 of each plate-like connector member 8 can be cut along cutting lines 10 with a dicing machine, a cutter grinder, or a cutting machine, so that non-required portions 12 of the first and second metal coatings are removed from the side face 11 (see step S5 in FIG. 1).

Figure 5A:
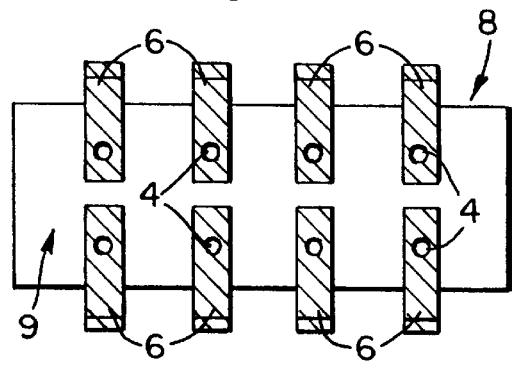
FIG. 5A is a view of the front face of the connector member formed by the method of the present invention, wherein the front face contains conductive and non-conductive patterns.
Figure 5B:
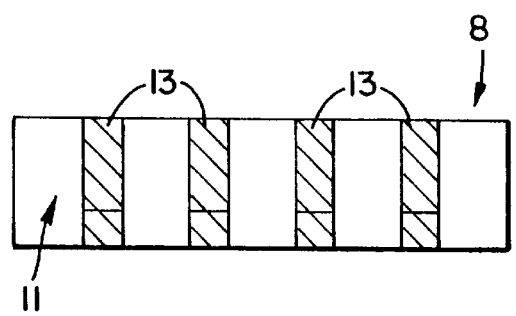
FIG. 5B is a view of a side face of the connector member formed by the method of the present invention, wherein the side face contains conductive and non-conductive patterns.
Figure 5C:
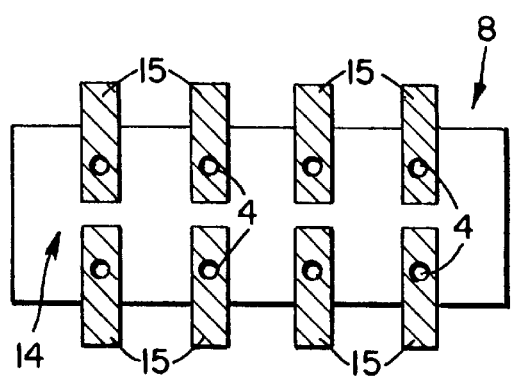
FIG. 5C is a view of the rear face of the connector member formed by the method of the present invention, wherein the rear face contains conductive and non-conductive patterns.

FIGS. 5A–5C show a resulting plate-like connector member after the removal of non-required portions 12.

Figure 6A:
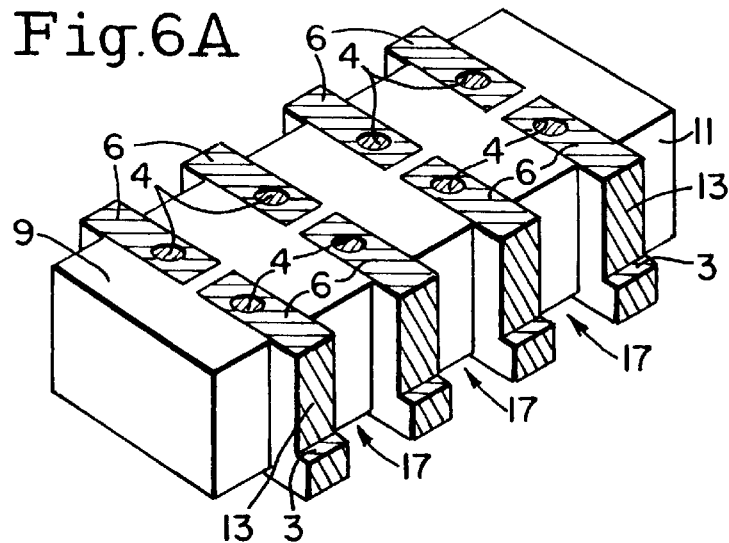
FIG. 6A is a perspective view of the front face of a connector formed according to the method of this invention.
Figure 6B:
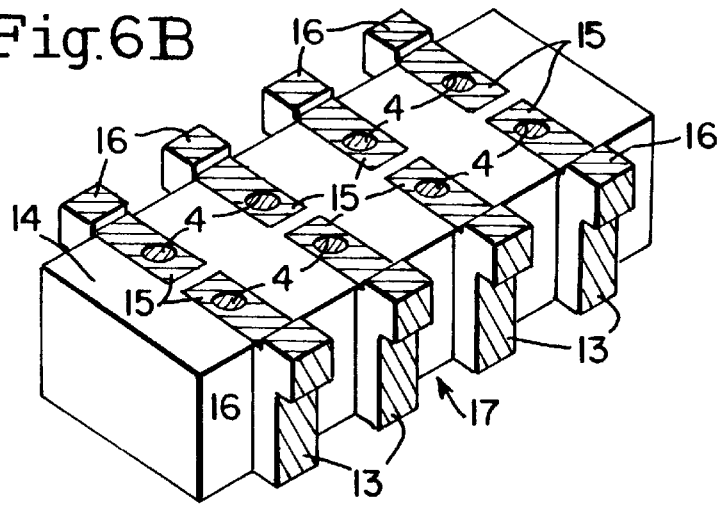
FIG. 6B is a perspective view of the rear face of a connector formed according to the method of this invention.

FIGS. 6A and 6B are perspective views illustrating, respectively, a front face and a rear face of a detached connector member prepared by the method of this invention.

As illustrated in FIGS. 5A–5C, 6A and 6B, one terminal includes side-face conductive patterns 13 remaining on the side face 11 through the removal process as well as the conductive patterns 6 formed on front face 9 and conductive patterns 15 formed on rear face 14. Connection pins of a corresponding electric part, such as an IC, a capacitor, or a resistance, are inserted into the through-holes 4. Surface mounting technology (SMT) is applied to allow the connector to attach directly to a circuit board. In the drawings, the numeral 16 denotes a contact surface which comes into contact with a circuit board, and the numeral 17 represents a remaining surface after the removal of non-required portions 12 from the side face.

Figure 7:
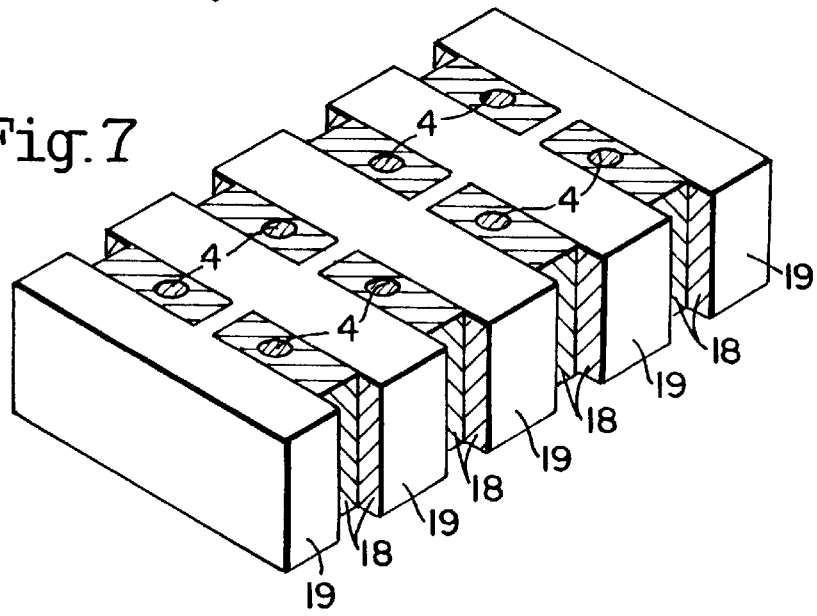
FIG. 7 is a perspective view of a second connector member formed according to the method of this invention.

FIG. 7 is a perspective view illustrating another connector manufactured according to the method of this invention. In FIG. 7, the numeral 18 represents a contact surface which comes into contact with a connection terminal projected from a circuit board, and the numeral 19 shows a remaining surface after the removal of a non-required portion of the first and second metal coatings. This method allows desired conductive patterns to be formed on vertical faces of grooves arranged on a side face of a connector.

Whereas the conventional methods require rather complicated manufacturing processes of separately preparing a metal-plated body and a non-plated body and integrally joining the metal-plated body and the non-plated body with each other, the method of the present invention can form a desired conductive pattern directly on a side face of a molded object prepared by single injection molding. The method of this invention accordingly reduces the time and labor required for manufacturing connectors. As mentioned previously herein, the method of this invention requires only one material for forming the main body of the connector, thus effectively reducing the manufacturing cost. Application of a multi-forming mold allows a plurality of connector members to be prepared simultaneously. This further improves the efficiency of production.

What is claimed is:

1. A method of simultaneously manufacturing a plurality of connectors each having conductive patterns formed on a front face, a rear face and one or two opposite side faces thereof, comprising the steps of:

(A) molding a resin in a single multiforming mold to form a connector member assembly comprising a plurality of connector members and a plurality of runners attached to the members, each connector member having a front face, a rear face, and one or two opposite longitudinally elongated through-holes which extend from the front face to the rear face along opposite sides of said connector member, wherein each through-hole has an inner surface;

(B) forming a first metal coating on the front and rear faces and on an inner surface of each through-hole;

(C) after step (B), providing metal-platable and non-metal-platable regions on each first-metal-coated front and rear face;

(D) after step (C), forming a second metal coating on the metal-platable regions to form conductive patterns and on each first-metal-plated inner surface to form a conductive inner surface;

(E) after step (D), removing the first metal coating from the non-metal-platable regions to form non-conductive patterns;

(F) after steps (A)–(E), detaching each connector member from the connector assembly, each detached member having one or two side faces containing the metal-plated inner surface of the one or two through-holes; and (G) in each detached member, removing the first and second metal coatings from a portion of each side face to form a side-face conductive pattern disposed in electrical communication with the conductive patterns of the front and rear faces of said detached member.

2. A method according to claim 1, wherein each elongated through-hole is a slit.

3. A method according to claim 1, wherein said resin is a thermoplastic resin.

4. A method according to claim 1, wherein said resin is injection-molded to form said molded connector member.

5. A method according to claim 1, wherein said metal-platable regions and non-metal-platable regions are formed by a masking process.

6. A method according to claim 1, wherein said metal-platable regions and non-metal-platable regions are formed by a laser beam patterning process.

* * * * *